United States Patent
Shin et al.

(10) Patent No.: US 7,348,190 B2
(45) Date of Patent: Mar. 25, 2008

(54) METHOD OF DETECTING A DEFECT IN A SEMICONDUCTOR DEVICE

(75) Inventors: Hyun-Beom Shin, Seongnam-si (KR); Sang-Oh Park, Yonin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 355 days.

(21) Appl. No.: 11/175,439

(22) Filed: Jul. 7, 2005

(65) Prior Publication Data

US 2006/0019419 A1   Jan. 26, 2006

(30) Foreign Application Priority Data

Jul. 21, 2004   (KR) ........................ 10-2004-0056864

(51) Int. Cl.
*G01R 31/26* (2006.01)
*H01L 21/66* (2006.01)

(52) U.S. Cl. ........................ 438/15; 438/14; 324/551

(58) Field of Classification Search ............... 438/14, 438/15; 324/551

See application file for complete search history.

(56) References Cited

FOREIGN PATENT DOCUMENTS

| JP | 05-264468 | 10/1993 |
|---|---|---|
| JP | 11-074493 | 3/1999 |
| JP | 11-248608 | 9/1999 |
| KR | 1997-23948 | 5/1997 |
| KR | 10-2002-0034351 A | 5/2002 |

OTHER PUBLICATIONS

Korean Office Action dated Feb. 13, 2006 for KR 10-2004-0056864.

*Primary Examiner*—David Zarneke
*Assistant Examiner*—Jenny L. Wagner
(74) *Attorney, Agent, or Firm*—Harness, Dickey & Pierce, P.L.C.

(57) ABSTRACT

A method of detecting a defect in a semiconductor device may involve immersing a substrate into a chemical solution. The substrate may support a metal wiring and an insulation layer may cover the metal wiring. The chemical solution may permeate through the defect such as a pinhole and/or a crack (for example) of the insulation layer, and may corrode the metal wiring. The metal wiring may be inspected for corrosion to detect the defect of the insulation layer. The method may be implemented before packaging the semiconductor device.

20 Claims, 2 Drawing Sheets

METHOD OF DETECTING A DEFECT IN A SEMICONDUCTOR DEVICE

PRIORITY STATEMENT

This application claims benefit of priority under 35 USC § 119 from Korean Patent Application No. 2004-56864 filed on Jul. 21, 2004, the content of which is incorporated herein by reference in its entirety.

BACKGROUND

1. Field of the Invention

The present invention relates generally to a method of detecting a defect in a semiconductor device. More particularly, the present invention relates to a method of detecting a defect in a semiconductor device having a conductive structure and an insulation layer.

2. Description of the Related Art

A semiconductor device may include, among other things, a conductive structure (e.g., a metal wiring) and an insulation layer. The semiconductor device may be manufactured using technologies designed to improve integration degree, reliability and response speed of the semiconductor device. To this end, a width of the conductive structure (e.g., a metal wiring) of the semiconductor device may be reduced and burying characteristics of the insulation layer may be enhanced.

The semiconductor device (including the conductive structure and the insulation layer) may be packaged. The packaged semiconductor device may be tested (e.g., subjected to environmental tests) to confirm a fault-free operation of the semiconductor device. The tests may involve (for example) measuring electrical characteristics of the semiconductor device to detect whether a defect is present in the semiconductor device.

When a defect in the semiconductor device is repeatedly detected, process conditions related to the defect may be improved. However, according to conventional techniques, testing may be performed on the packaged semiconductor device, and thus time for obtaining improved process conditions may be more than about 10 days. Further, a detecting efficiency of the packaged semiconductor device may be low because, for example, process parameters and/or data dependent on several patterns may be obtained through several tests.

Improved process conditions may be obtained using conventional methods, and a semiconductor device manufactured under the improved process conditions (and packaged) may be tested. The tests for the packaged semiconductor device may be carried out, and thus time for confirming the improved process conditions may be more than 10 days. Hence, the conventional methods may consume more than 20 days and/or excessive costs.

SUMMARY

According to an example, non-limiting embodiment of the present invention, a method may involve immersing a substrate having into a chemical solution. The substrate may have a metal wiring and an insulation layer may be provided on the metal wiring. A portion of the metal wiring may be corroded in accordance with a permeation of the chemical solution through a defect of the insulation layer. The metal wiring may be inspected for corrosion to detect the defect of the insulation layer.

According to another example, non-limiting embodiment of the present invention, a method may involve adjusting process conditions for forming an insulation layer when a defect of a prior insulation layer is detected. The insulation layer may be formed on a substrate under the adjusted process conditions to cover a first metal wiring that may be formed on the substrate. A second metal wiring may be formed on the insulation layer. The second metal wiring may have a thermal expansion coefficient different from that of the first metal wiring. The substrate may be immersed into a chemical solution including ammonium hydroxide and hydrogen peroxide. The first metal wiring may be corroded in accordance with a permeation of the chemical solution through a defect of the insulation layer. The first metal wiring may be inspected for corrosion to detect the defect of the insulation layer According to another example, non-limiting embodiment of the present invention, a method may involve placing a substrate in a chemical solution. The substrate may support a conductive structure and an insulation layer may cover the conductive structure. The conductive structure may be inspected for corrosion by the chemical solution to detect a defect in the insulation layer.

BRIEF DESCRIPTION OF THE DRAWINGS

Example, non-limiting embodiments of the present invention will be readily apparent by reference to the following detailed description thereof when considered in conjunction with the accompanying drawings, wherein like reference numerals designate like structural elements.

DETAILED DESCRIPTION OF EXAMPLE, NON-LIMITING EMBODIMENTS

Figure 1:
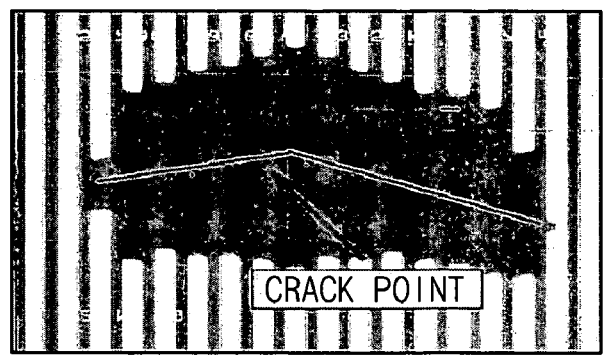
FIG. 1 is a scanning electron microscope (SEM) picture of a partial corrosion of a wiring covered with an insulation layer having a crack according to an example embodiment of the present invention.

Example, non-limiting embodiments of the invention will be described in detail with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention. In the drawings, the size and relative sizes of layers and regions may be exaggerated for clarity. The drawings are not to scale.

It will be understood that when an element or layer is referred to as being "on," "connected to" and/or "coupled to" another element or layer, the element or layer may be directly on, connected or coupled to the other element or layer or intervening elements or layers may be present. In contrast, when an element is referred to as being "directly on," "directly connected to" and/or "directly coupled to" another element or layer, there may be no intervening elements or layers present. As used herein, the term "and/or" may include any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath", "below", "lower", "above", "upper" and the like, may be used to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence and/or addition of one or more other features, integers, steps, operations, elements, components, and/or groups thereof.

Example embodiments of the invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, the disclosed example embodiments of the invention should not be construed as limited to the particular shapes of regions illustrated herein but are to include deviations in shapes that result, for example, from manufacturing.

Unless otherwise defined, all terms (including technical and scientific terms) used herein may have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In general, reliability evaluation of a semiconductor device, which may include a conductive structure (e.g., a metal wiring) and an insulation layer formed on the conductive structure, may be carried out to confirm a fault-free operation after manufacturing and packaging the semiconductor device. The packaged semiconductor device may occasionally have a failure (e.g., a standby current failure). When a failure of the semiconductor device is generated, the semiconductor device may be physically sectioned and then a cross-section of the semiconductor device may be observed using a transmission electron microscope (TEM) and/or a scanning electron microscope (SEM), for example, to analyze a cause of the failure.

As a result of an observation of the cross-section of the semiconductor device, a defect such as a pinhole and/or a crack, for example, may be detected in the insulation layer of the semiconductor device. An inter-laminar peeling may be detected at the interface between the metal wiring and the insulation layer. The defect such as the inter-laminar peeling, the crack and/or the pinhole in the insulation layer may absorb moisture in the semiconductor device to thereby generate the failure. The metal wiring may include tungsten (W), tungsten silicide (WSi), aluminum (Al), copper (Cu), for example. The metal wiring may typically include tungsten. The insulation layer may include, for example, a first plasma enhanced-tetraethyl orthosilicate (PE-TEOS) film, a flowable oxide (FOX) film formed on the first PE-TEOS film, and a second PE-TEOS film formed on the FOX film.

After a defect in the insulation layer is analyzed, process conditions may be adjusted to reduce the likelihood of a defect occurring in a subsequently manufactured insulating layer. The defect in the insulation layer and improvements of the process conditions will be described in accordance with an example, non-limiting embodiment of the present invention.

When the insulation layer including the first PE-TEOS film, the FOX film and the second PE-TEOS film is provided on the metal wiring, tetraethyl orthosilicate (TEOS) including excessive oxygen may be reacted with tungsten in the metal wiring in an oxygen ($O_2$) plasma process to thereby form tungsten oxide ($WO_3$). The tungsten oxide may be vaporized. Thus, an adhesion failure between the metal wiring and the insulation layer may occur, thereby generating an inter-laminar peeling at the interface between the metal wiring and the insulation layer.

For example, a metal layer may be formed on the insulation layer in a successive process and may be reflowed at a temperature of about 540° C. The FOX film of the insulation layer may be shrunk at relatively high temperatures. Further, a difference in the thermal expansion coefficient between the metal layer and the metal wiring may generate stress, and thus this stress may cause the inter-laminar peeling and deformation of the insulation layer. As a result, the defect such as the pinhole and/or the crack may be generated in the insulation layer.

After analyzing the defect in the insulation layer, process conditions may be adjusted to reduce the likelihood of a defect occurring in a subsequently manufactured insulation layer.

Under the adjusted process conditions, an insulation layer having improved characteristics may be provided on a metal wiring positioned on a substrate.

According to one example, non-limiting embodiment of the present invention, an insulation layer may have a first multi-layer structure. The first multi-layer structure may include, for example, a first plasma enhanced oxide (PEOX) film formed on a metal wiring, a spin-on glass (SOG) film formed on the first PEOX film, an undoped silicate glass (USG) film formed on the SOG film and a second PEOX film on the USG film. In this example embodiment, the first multi-layer structure may include oxide films only.

According to another example, non-limiting embodiment of the present invention, an insulation layer may have a second multi-layer structure. The second multi-layer structure may include, for example, a first PE-TEOS film formed on a metal wiring, a FOX film formed on the first PE-TEOS film, a second PE-TEOS film formed on the FOX film, a first nitride film formed on the second PE-TEOS film, and a second nitride film formed on the first nitride film. In this example embodiment, the second multi-layer structure may include oxide films and one or more nitride films.

The first PEOX film and the second PEOX film of the insulation layer may be formed, for example, by a treatment using a silicon-containing gas such as silane ($SiH_4$) with a nitrous oxide ($N_2O$) plasma. Here, nitrogen (N) may serve as impurities at an interface between the metal wiring and the insulation layer, and thus a compound including tungsten-nitrogen-oxygen (W—N—O) bonds may be formed at the interface. The compound containing the W—N—O bonds may improve adhesion characteristics between the insulation layer and the metal wiring, thereby reducing the defect such as (for example) the pinhole and/or the crack in the insulation layer.

After forming the insulation layer under the adjusted process conditions, a defect-detecting process may be performed to confirm reliability of the insulation layer.

According to conventional wisdom, defect-detecting tests may be performed on a packaged semiconductor device, and thus time loss in a manufacturing process for the semiconductor device may be more than about 20 days. In addition, when a defect exists in an insulation layer, process conditions may be corrected and a defect-detecting process may be repeated. Thus, time loss in the manufacturing process may be augmented.

According to example, non-limiting embodiments of the present invention, however, a semiconductor device may be inspected at an early stage of manufacture. In other words, a defect such as a pinhole and/or a crack, for example, in the insulation layer may be detected before packaging the semiconductor device.

In a method of detecting the defect in the semiconductor device according to one example, non-limiting embodiment of the present invention, the substrate having a metal wiring (or some other conductive member) and an insulation layer provided thereon may be immersed into a chemical solution so that a portion of the metal wiring may be corroded in accordance with a permeation of the chemical solution through a defect of the insulation layer. That is, if a defect exists in the insulation layer, then the chemical solution may permeate through the insulation layer (via the defect) and contact and corrode the metal wiring. The corrosion amount of the metal wiring may depend, for example, on the severity of the defect in the insulation layer. The corroded portion of the metal wiring may correspond to the location of the defect that may exist in the insulation layer. The defect in the semiconductor device may therefore be detected by recognizing an existence and/or dimensions of the defect of the insulation layer in accordance with an observation of a corrosion of the metal wiring.

The chemical solution may be prepared to selectively etch the material (e.g., tungsten (W)) from which the metal wiring is fabricated relative to the insulation layer, and to permeate through a pinhole and/or a crack that may be present in the insulation layer. The chemical solution may include, for example, a tungsten-etching agent that may contain ammonium hydroxide ($NH_4OH$) and hydrogen peroxide ($H_2O_2$). In alternative embodiments, numerous other alternative etching agents may be suitably implemented.

According to an example embodiment of the present invention, a first chemical solution and a second chemical solution may be used. The first chemical solution may include, for example, ammonium hydroxide, hydrogen peroxide and pure water by a volume ratio of about 1:4:3 to about 1:6:5, preferably, a volume ratio of about 1:5:4. In alternative embodiment, the constituent components may be provided at other volume ratios.

The second chemical solution may include, for example, ammonium hydroxide, hydrogen peroxide and an additive by a volume ratio of about 1:17:0.001 to about 1:21:0.01, preferably, a volume ratio of about 1:18:0.002 to about 1:20:0.009. In alternative embodiments, the constituent components may be provided at other volume ratios. The additive may enhance permeation characteristics of the etching agent through defects that may exist in the insulation layer.

The additive may be added to the first chemical solution to enhance permeantion characteristics through a pinhole and/or a crack of the insulation layer to thereby accelerate the corrosion of the metal wiring. By way of example only, the additive may include FSJ and/or F141 (both are trade name manufactured by Asahi Glass Co., Ltd. in Japan). The second chemical solution may include, for example, based on a total weight of the second chemical solution, the ammonium hydroxide by a concentration of about 25 wt % to about 35 wt % and the hydrogen peroxide by a concentration of about 25 wt % to about 35 wt %. In alternative embodiments, the ammonium hydroxide and the hydrogen peroxide may be provided at other weight percents.

In an example embodiment of the present invention, the chemical solution may be employed as an etching agent to form the metal wiring, as well as a defect-detecting agent of the insulation layer that may be formed on the metal wiring.

By way of example only, the chemical solution may be maintained at a temperature of about 40° C. to about 60° C., while the substrate may be immersed into the chemical solution for about 20 minutes to about 40 minutes. In alternative embodiments, the chemical solution may be maintained at other temperatures and the substrate may be immersed for other durations.

When the chemical solution is maintained at a temperature of about 40° C. to about 60° C., a reacting rate of the chemical solution may be accelerated. In this way, the immersing time may be reduced for corroding the portion of the metal wiring in accordance with the permeation of the chemical solution through the defect of the insulation layer.

The chemical solution that may remain on the substrate (after immersion) may be removed by rinsing the substrate using deionized water (for example). The remaining deionized water on the substrate may be removed through a drying process (for example).

The substrate (having the metal wiring and the insulation layer formed on the metal wiring) may be inspected for corrosion of the metal wiring.

When a defect (such as a pinhole and/or a crack, for example) exists in the insulation layer, the chemical solution may permeate through the pinhole and/or the crack of the insulation layer and corrode the metal wiring.

Figure 2:
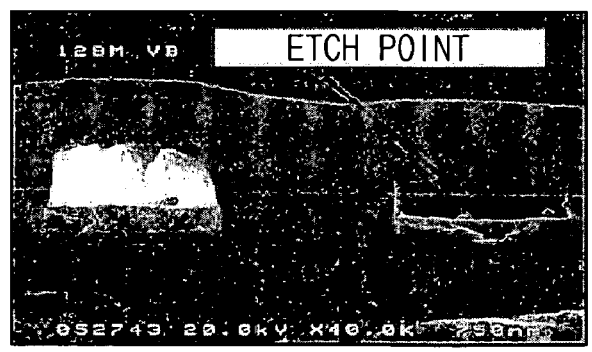
FIG. 2 is a SEM picture of across-section of an insulation layer having a crack according to an example embodiment of the present invention.

FIG. 1 is a SEM picture of the corrosion of the metal wiring covered with an insulation layer having a crack according to an example embodiment of the present invention, and FIG. 2 is a SEM picture of a cross-section of the insulation layer having the crack according to an example embodiment of the present invention.

When a crack (or other defect) exists in the insulation layer, the corrosion of the metal wiring may be observed as illustrated in FIGS. 1 and 2. The defect of the insulation layer may be detected through the observation of the corroded metal wiring and without observing a cross-section of the insulation layer.

By observing the corrosion of the metal wiring using a transmission electron microscope (TEM) and/or a scanning electron microscope (SEM), for example, an existence and dimensions of the defect of the insulation layer may be recognized, and thus the defect in the semiconductor device may be detected.

When a defect of the insulation layer is detected, the process conditions for forming the insulation layer may be adjusted, and a defect-detecting process may be repeated on a subsequently manufactured substrate. When a defect of the insulation layer of a subsequently manufactured substrate is not detected, that substrate may be subject to successive manufacturing processes, e.g., packaging processes.

The method of detecting a defect in a semiconductor device may reduce manufacturing time and costs.

The method of detecting a defect in a semiconductor device according to example, non-limiting embodiments of the present invention will be further explained through the following Examples.

EXAMPLE 1

Figure 3:
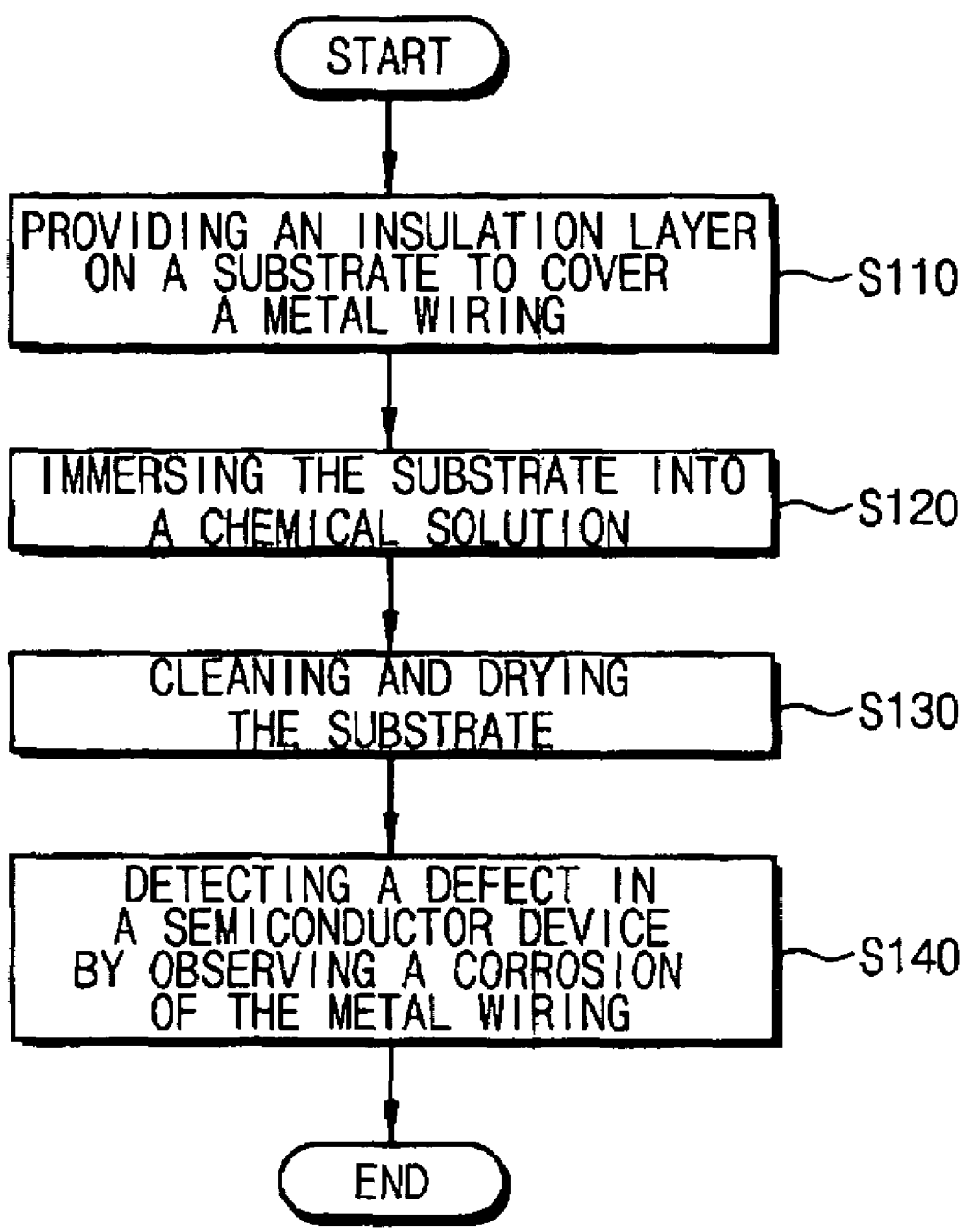
FIG. 3 is a flow chart of a method that may be implemented to detect a defect in a semiconductor device according to an example embodiment of the present invention.

FIG. 3 is a flow chart of a method of detecting a defect in a semiconductor device according to an example, non-limiting embodiment of the present invention.

Referring to FIG. 3, a first insulation layer was provided on a substrate (at S110) to cover a metal wiring provided on the substrate. By way of example only, the metal wiring was fabricated from tungsten. The first insulation layer included, for example, a first PE-TEOS film having a thickness of about 1,500 Å (for example) provided on the tungsten wiring, a FOX film having a thickness of about 3,800 Å (for example) provided on the first PE-TEOS film, and a second PE-TEOS film having a thickness of about 3,500 Å (for example) formed on the FOX film. The first insulation layer was reflowed at a temperature of about 540° C., for example.

A container including a first chemical solution was prepared. The container had a sufficient depth to immerse the substrate, and the first chemical solution was maintained at a temperature of about 50° C. (for example). The substrate having the first insulation layer thereon was immersed into the first chemical solution for about 30 minutes, for example (at S120). The first chemical solution included, for example, ammonium hydroxide, hydrogen peroxide and pure water by a volume ratio of about 1:5:4, for example.

After immersion, the remaining first chemical solution on the substrate was removed by rinsing the substrate using deionized water (for example), and remaining deionized water on the substrate was removed through a drying process, for example (at S130).

The tungsten wiring was inspected (at S140)(using a transmission electron microscope (TEM) and/or a scanning electron microscope (SEM), for example) for corrosion. A corroded tungsten wiring would indicate the presence and/or location of a defect of the first insulation layer.

In Example 1, a corrosion of the tungsten wiring was not observed, indicating that a defect may not exist in the first insulation layer, as illustrated in Table 1 below.

EXAMPLE 2

A first insulation layer was evaluated by performing similar procedure to that of Example 1, except that a second chemical solution was used instead of the first chemical solution. The second chemical solution included, for example, ammonium hydroxide, hydrogen peroxide and an additive (e.g., FSJ, trade name manufactured by Asahi Glass Co., Ltd. in Japan) by a volume ratio of about 1:19:0.003, for example. In Example 2, a corrosion of the tungsten wiring was not observed.

EXAMPLE 3

A first insulation layer was evaluated by performing a process similar to that of Example 1, except that a third chemical solution was used instead of the first chemical solution. Here, the third chemical solution included, for example, ammonium hydroxide, hydrogen peroxide and an additive (e.g., F141, trade name manufactured by Asahi Glass Co., Ltd. in Japan) by a volume ration of about 1:19:0.004, for example. In Example 3, a corrosion of the tungsten wiring was not observed.

EXAMPLE 4

A substrate having a first insulation layer was thermally stressed about thirty times at a temperature of about 400° C. The thermally stressed first insulation layer was evaluated by performing a process similar to that of Example 1. In Example 4, a corrosion of the tungsten wiring was not observed.

EXAMPLE 5

A thermally stressed first insulation layer was evaluated by performing a process similar to that of Example 1, except that a second chemical solution was used instead of the first chemical solution. The second chemical solution included, for example, ammonium hydroxide, hydrogen peroxide and an additive (e.g., FSJ, trade name manufactured by Asahi Glass Co., Ltd. in Japan) by a volume ratio of about 1:19:0.002, for example. In Example 5, a corrosion of the tungsten wiring was not observed.

EXAMPLE 6

A thermally stressed first insulation layer was evaluated by performing a process similar to that of Example 1, except that a third chemical solution was used instead of the first chemical solution. The third chemical solution included, for example, ammonium hydroxide, hydrogen peroxide and an additive (e.g., F141, trade name manufactured by Asahi Glass Co., Ltd. in Japan) by a volume ratio of about 1:19:0.003, for example. In Example 6, a corrosion of the tungsten wiring was not observed.

EXAMPLE 7

An aluminum layer was formed on a first insulation layer similar to that of Example 1, and an aluminum wiring was formed by reflowing the aluminum layer at a temperature of about 540° C., for example. The first insulation layer, on which the aluminum wiring was formed, was evaluated by performing a process similar to that of Example 1. In Example 7, a corrosion of the tungsten wiring was observed.

EXAMPLE 8

A first insulation layer, on which an aluminum wiring was formed, was evaluated by performing a process similar to that of Example 7, except that a second chemical solution was used instead of the first chemical solution. The second chemical solution included, for example, ammonium hydroxide, hydrogen peroxide and an additive (FSJ, trade name manufactured by Asahi Glass Co., Ltd. in Japan) by a volume ratio of about 1:19:0.002, for example. In Example 8, a corrosion of the tungsten wiring was observed.

EXAMPLE 9

A first insulation layer, on which an aluminum wiring was formed, was evaluated by performing a process similar to that of Example 7, except that a third chemical solution was used instead of the first chemical solution. The third chemical solution included, for example, ammonium hydroxide, hydrogen peroxide and an additive (F141, trade name manufactured by Asahi Glass Co., Ltd. in Japan) by a volume ratio of about 1:19:0.003, for example. In Example 9, a corrosion of the tungsten wiring was observed.

EXAMPLE 10

A second insulation layer was provided on a substrate to cover a metal wiring provided on the substrate. By way of example only, the metal wiring was fabricated from tungsten. The second insulation layer included, for example, a PE-TEOS film having a thickness of about 2,000 Å (for example) and a FOX film having a thickness of about 3,300 Å (for example) formed on the PE-TEOS film. The second insulation layer was evaluated by performing a process similar to that of Example 7. In Example 10, a corrosion of the tungsten wiring was observed.

EXAMPLE 11

A second insulation layer, on which an aluminum wiring was formed, was evaluated by performing a process similar to that of Example 10, except that a second chemical solution was used instead of the first chemical solution. In Example 10, a corrosion of the tungsten wiring was observed.

EXAMPLE 12

A second insulation layer, on which an aluminum wiring was formed, was evaluated by performing a process similar to that of Example 10, except that a third chemical solution was used instead of the first chemical solution. In Example 12, a corrosion of the tungsten wiring was observed.

EXAMPLE 13

A third insulation layer was thermally stressed about ten times at a temperature of about 400° C., fore example. The third insulation layer was evaluated by performing a process similar to that of Example 4. The third insulation layer included, for example, a first PEOX film, a SOG film provided on the first PEOX film, a USG film provided on the SOG film, and a second PEOX film formed on the USG film. In Example 13, a corrosion of the tungsten wiring was not observed.

EXAMPLE 14

A thermally stressed third insulation layer was evaluated by performing a process similar to that of Example 13, except that a second chemical solution was used instead of the first chemical solution. In Example 14, a corrosion of the tungsten wiring was not observed.

EXAMPLE 15

A thermally stressed third insulation layer was evaluated by performing a process similar to that of Example 13, except that a third chemical solution was used instead of the first chemical solution. In Example 15, a corrosion of the tungsten wiring was not observed.

EXAMPLE 16

An aluminum layer was formed on a third insulation layer similar to that of Example 13, and an aluminum wiring was formed by reflowing the aluminum layer at a temperature of about 540° C., for example. The third insulation layer, on which the aluminum wiring was formed, was evaluated by performing a process substantially identical to that of Example 13. In Example 16, a corrosion of the tungsten wiring was not observed.

EXAMPLE 17

A third insulation layer, on which an aluminum wiring was formed, was evaluated by performing a process similar to that of Example 16, except that a second chemical solution was used instead of the first chemical solution. In Example 17, a corrosion of the tungsten wiring was not observed.

EXAMPLE 18

A third insulation layer, on which an aluminum wiring was formed, was evaluated by performing a process similar to that of Example 16, except that a third chemical solution was used instead of the first chemical solution. In Example 18, a corrosion of the tungsten wiring was not observed.

Reliability Evaluation of the Method of Detecting a Defect

The insulation layers used in the method of detecting a defect according to Examples 1 to 18, were physically sectioned and observed to evaluate reliability of the method of detecting the defect in a semiconductor device. An existence of a defect such as a pinhole and/or a crack (for example) in the insulation layers of Examples 1 to 18 was evaluated in accordance with an observation of cross-sections of the insulation layers. The corrosion of the tungsten wiring according to Examples 1 to 18 was respectively compared with an observation of the cross-sectioned insulation layers.

TABLE 1

|  | Corrosion | A pinhole and/or a crack |
| --- | --- | --- |
| Example 1 | Not corroded | Does not exist |
| Example 2 | Not corroded | Does not exist |
| Example 3 | Not corroded | Does not exist |
| Example 4 | Not corroded | Does not exist |
| Example 5 | Not corroded | Does not exist |
| Example 6 | Not corroded | Does not exist |
| Example 7 | Corroded | Exists |
| Example 8 | Corroded | Exists |
| Example 9 | Corroded | Exists |
| Example 10 | Corroded | Exists |
| Example 11 | Corroded | Exists |
| Example 12 | Corroded | Exists |
| Example 13 | Not corroded | Does not exist |
| Example 14 | Not corroded | Does not exist |
| Example 15 | Not corroded | Does not exist |
| Example 16 | Not corroded | Does not exist |

TABLE 1-continued

| | Corrosion | A pinhole and/or a crack |
|---|---|---|
| Example 17 | Not corroded | Does not exist |
| Example 18 | Not corroded | Does not exist |

As illustrated in Table 1, it may be confirmed that corrosion the tungsten wirings according to the present invention may coincide with observation of a cross-sectioned insulation layer. Therefore, the method of detecting a defect in a semiconductor device according to the present invention may have sufficient reliability.

In the method according to example, non-limiting embodiments of the present invention, a defect such as a pinhole and/or a crack (for example) of an insulation layer may be detected by observing corrosion of a metal wiring and without observing a cross-sectioned insulation layer.

In the method according to example, non-limiting embodiments of the present invention, defects such as the pinhole and/or the crack (for example) of the insulation layer may be detected before packaging a semiconductor device. Hence, the semiconductor device may have improved characteristics and also manufacturing time and costs may be reduced.

The foregoing is illustrative of the present invention and is not to be construed as limiting thereof. Although example embodiments of this invention have been described, those skilled in the art will readily appreciate that many modifications are possible in the example embodiments without departing from the spirit and scope of the invention. Accordingly, all such modifications are intended to be included within the scope of this invention, as defined in the claims. It is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method comprising:
immersing a substrate into a chemical solution, the substrate having a first metal wiring and an insulation layer provided on the first metal wiring;
corroding the first metal wiring in accordance with a permeation of the chemical solution through a defect of the insulation layer; and
inspecting the first metal wiring for corrosion to detect the defect of the insulation layer.

2. The method of claim 1, further comprising:
prior to immersing,
adjusting process conditions for forming a prior insulation layer when a defect of the prior insulation layer is detected; and
forming the insulation layer on the substrate under the adjusted process conditions.

3. The method of claim 2, wherein the prior insulation layer comprises a first plasma enhanced tetraethyl orthosilicate film, a flowable oxide film formed on the first plasma enhanced tetraethyl orthosilicate film, and a second plasma enhanced tetraethyl orthosilicate film formed on the flowable oxide film.

4. The method of claim 1, wherein the insulation layer comprises a first plasma enhanced tetraethyl orthosilicate film formed on the first metal wiring, a flowable oxide film formed on the first plasma enhanced tetraethyl orthosilicate film, and a second plasma enhanced tetraethyl orthosilicate film formed on the flowable oxide film.

5. The method of claim 1, wherein the insulation layer comprises a first plasma enhanced oxide film formed on the first metal wiring, a spin on glass film formed on the first plasma enhanced oxide film, an undoped silicate glass film formed on the spin on glass film, and a second plasma enhanced oxide film formed on the undoped silicate glass film.

6. The method of claim 1, further comprising:
forming the insulation layer by,
forming at least one oxide layer on the first metal wiring; and
reflowing the at least one oxide layer at a temperature of about 350° C. to about 500° C.

7. The method of claim 1, wherein the first metal wiring comprises at least one material selected from the group consisting of tungsten, tungsten silicide, aluminum and copper.

8. The method of claim 1, further comprising forming a second metal wiring on the insulation layer, the second metal wiring having a different thermal expansion coefficient from that of the first metal wiring.

9. The method of claim 8, wherein forming the second metal wiring comprises:
depositing aluminum to form an aluminum layer on the insulation layer; and
thermally treating the aluminum layer at a temperature of about 500° C. to about 600° C.

10. The method of claim 8, wherein the defect includes at least one of a pinhole and a crack, the defect being generated by a difference of thermal expansion coefficients between the first metal wiring and the second metal wiring.

11. The method of claim 1, wherein the chemical solution comprises ammonium hydroxide, hydrogen peroxide and pure water by a volume ratio of about 1:4:3 to about 1:6:5.

12. The method of claim 1, wherein the chemical solution comprises ammonium hydroxide, hydrogen peroxide and an additive by a volume ratio of about 1:17: 0.001 to about 1:21:0.01.

13. The method of claim 12, wherein the chemical solution comprises the ammonium hydroxide by a concentration of about 25 wt % to about 35 wt % and the hydrogen peroxide by a concentration of about 25 wt % to about 35 wt %.

14. The method of claim 1, wherein the substrate is immersed into the chemical solution having a temperature of about 40° C. to about 60° C. for about 20 minutes to about 40 minutes.

15. A method comprising:
adjusting process conditions for forming an insulation layer when a defect of a prior insulation layer is detected;
forming the insulation layer on a substrate under the adjusted process conditions to cover a first metal wiring formed on the substrate;
forming a second metal wiring on the insulation layer, the second metal wiring having a thermal expansion coefficient different from that of the first metal wiring;
immersing the substrate into a chemical solution including ammonium hydroxide and hydrogen peroxide;
corroding the first metal wiring in accordance with a permeation of the chemical solution through a defect of the insulation layer; and
inspecting the first metal wiring for corrosion to detect the defect of the insulation layer.

16. The method of claim 15, wherein the insulation layer comprises a first plasma enhanced tetraethyl orthosilicate film formed on the first metal wiring, a flowable oxide film formed on the first enhanced tetraethyl orthosilicate film, a second plasma enhanced tetraethyl orthosilicate film formed on the flowable oxide film, and a nitride film formed on the second plasma enhanced tetraethyl orthosilicate film.

17. The method of claim 15, wherein the insulation layer comprises a first plasma enhanced oxide film formed on a first metal wiring, a spin on glass film formed on the first plasma enhanced oxide film, an undoped silicate glass film formed on the spin on glass film, and a second plasma enhanced oxide film formed on the undoped silicate glass film.

18. The method of claim 15, wherein the chemical solution comprises ammonium hydroxide, hydrogen peroxide and an additive in a volume ratio of about 1:17:0.001 to about 1:21:0.01.

19. The method of claim 15, wherein the first metal wiring comprises at least one material selected from the group consisting of tungsten, tungsten silicide, aluminum and copper.

20. A method comprising:
placing a substrate in a chemical solution, the substrate supporting a conductive structure and an insulation layer covering the conductive structure; and
inspecting the conductive structure for corrosion by the chemical solution to detect a defect in the insulation layer.

* * * * *